(12) United States Patent
Lin

(10) Patent No.: US 7,479,706 B2
(45) Date of Patent: Jan. 20, 2009

(54) CHIP PACKAGE STRUCTURE

(75) Inventor: Hung Tsun Lin, Tainan County (TW)

(73) Assignee: ChipMOS Technologies Inc., Hsinchu (TW)

( * ) Notice: Subject to any disclaimer, the term of this patent is extended or adjusted under 35 U.S.C. 154(b) by 0 days.

(21) Appl. No.: 11/773,437

(22) Filed: Jul. 5, 2007

(65) Prior Publication Data

US 2008/0164601 A1    Jul. 10, 2008

(30) Foreign Application Priority Data

Jan. 8, 2007    (TW) ............................... 96100679 A

(51) Int. Cl.
*H01L 23/29*    (2006.01)
(52) U.S. Cl. ...................... 257/787; 257/778
(58) Field of Classification Search ................. 257/778, 257/787
See application file for complete search history.

(56) References Cited

U.S. PATENT DOCUMENTS

| | | | |
|---|---|---|---|
| 5,710,071 A * | 1/1998 | Beddingfield et al. | 438/108 |
| 5,739,585 A * | 4/1998 | Akram et al. | 257/698 |
| 6,048,755 A * | 4/2000 | Jiang et al. | 438/118 |
| 6,326,700 B1 * | 12/2001 | Bai et al. | 257/790 |
| 6,870,274 B2 * | 3/2005 | Huang | 257/780 |
| 7,138,724 B2 * | 11/2006 | Grigg et al. | 257/782 |
| 7,235,896 B2 * | 6/2007 | Olijnyk | 307/9.1 |

\* cited by examiner

*Primary Examiner*—Roy K Potter
(74) *Attorney, Agent, or Firm*—Jianq Chyun IP Office

(57) ABSTRACT

A chip package structure includes a circuit substrate, a chip, an adhesive layer, conductive wires, and a molding compound. The circuit substrate has a first, a second surface, a slot, and a solder mask layer disposed on the first surface. The solder mask layer has a first and a second opening located at two sides of a longitude direction of the slot. The chip is disposed on the first surface and covers at least a portion of the slot. The adhesive layer is disposed between the chip and the circuit substrate and located at two sides of each of the slot, the first opening, and the second opening. The conductive wires connect the chip and the second surface through the slot. The molding compound covers the chip, the adhesive layer, and the conductive wires and the molding compound is further filling into the slot, the first and the second opening.

10 Claims, 4 Drawing Sheets

CHIP PACKAGE STRUCTURE

CROSS-REFERENCE TO RELATED APPLICATION

This application claims the priority benefit of Taiwan application serial no. 96100679, filed on Jan. 8, 2007. All disclosure of the Taiwan application is incorporated herein by reference.

BACKGROUND OF THE INVENTION

1. Field of the Invention

The present invention relates to a semiconductor structure. More particularly, the present invention relates to a chip package structure.

2. Description of Related Art

In a semiconductor industry, integrated circuits (IC) are produced mainly through three stages, namely, IC design, IC process, and IC package.

During the fabricating of the ICs, chips are formed by the steps of wafer manufacturing, IC formation, and wafer sawing. The wafer has an active surface which generally refers to a surface of the wafer on which a plurality of active devices is formed. After the IC within the wafer is finished, a plurality of bonding pads is further formed on the active surface of the wafer, such that the chip finally formed after wafer sawing may be externally electrically connected to a carrier through the bonding pads. The carrier is, for example, a lead frame or a package substrate. The chip may be connected to the carrier by wire bonding process or flip chip bonding process, such that the bonding pads of the chip are electrically connected to contacts of the carrier, thus forming a chip package structure.

FIG. 1A is a cross-sectional view of a conventional chip package structure, and FIG. 1B is a top view of some components of the conventional chip package structure in FIG. 1A. Referring to FIGS. 1A and 1B, for the convenience of illustration, the chip 120 is not shown but is indicated by a dashed line in FIG. 1B. Furthermore, only partial area of a circuit substrate 110 is shown in FIG. 1B.

Referring to FIGS. 1A and 1B together, the conventional chip package structure 100 includes a circuit substrate 110, a chip 120, an adhesive layer 130, a plurality of conductive wires 140, a molding compound 150, and a plurality of solder balls 160. The circuit substrate 110 has a first surface 110a, a second surface 110b, and a slot 112, and the chip 120 is disposed on the first surface 110a and covers at least a portion of the slot 112. Furthermore, the adhesive layer 130 is disposed between the chip 120 and circuit substrate 110, and located at both sides of the slot 112. The chip 120 is fixed to the circuit substrate 110 through the adhesive layer 130. The conductive wires 140 connect the chip 120 and the second surface 110b of the circuit substrate 110 through the slot 112. The molding compound 150 covers the chip 120, the adhesive layer 130, the conductive wires 140, and a portion of the circuit substrate 110, and the molding compound 150 is further filling into the slot 112. The solder balls 160 are disposed on the second surface 110b of the chip 130.

Since the materials of the adhesive layer 130 and molding compound 150 are different in properties, when the conventional chip package structure 100 is subjected to a reliability test, the region A in FIG. 1B may be damaged more possibly than other regions.

FIG. 2 is a top view of some components of another conventional chip package structure. Referring to FIG. 2, for the convenience of illustration, the chip 120, and the chip 120 is not shown but is indicated by a dashed line in FIG. 2. Furthermore, only partial area of the circuit substrate 110 is shown in FIG. 2.

Referring to FIG. 2, in order to reduce the probability that the region A in FIG. 1B may be damaged, in the conventional chip package structure (as shown in FIG. 1A), the adhesive layer 130a exposes the circuit substrate 110 in region A, so that the molding compound 150 may be filled in the region A. However, in order to allow the molding compound 150 to flow into the region A easily, the thickness of the adhesive layer 130a must be increased to extend the distance between the chip 120 and the circuit substrate 110. In other words, the chip package structure has a high cost of material.

SUMMARY OF THE INVENTION

In view of the above, the present invention provides a chip package structure, so as to increase the reliability.

The chip package structure provided by the present invention includes a circuit substrate, a chip, an adhesive layer, a plurality of first conductive wires, and a molding compound. The circuit substrate has a first surface, a second surface, a first slot, and a solder mask layer. The solder mask layer is disposed on the first surface and has a first opening and a second opening respectively exposing a portion of the first surface and respectively located beside the two long sides of the first slot. The chip is disposed on the first surface, and covers at least a portion of the first slot, the first opening, and the second opening. The adhesive layer is disposed between the chip and the circuit substrate and located at two sides of the first slot, the first opening, and the second opening. The chip is fixed on the circuit substrate through the adhesive layer. The first conductive wires connect the chip and the second surface of the circuit substrate through the first slot. The molding compound covers the chip, the adhesive layer, the first conductive wires, and a portion of the circuit substrate and the molding compound is further filled in the first slot, the first opening, and the second opening.

In an embodiment of the present invention, the first opening and the second opening are connected to the first slot, respectively.

In an embodiment of the present invention, the solder mask layer further has a third opening respectively exposing the first slot and a portion of the first surface at two sides in the longitudinal direction of the first slot.

In an embodiment of the present invention, the first opening and the second opening are connected to the third opening, respectively.

In an embodiment of the present invention, the first opening and the second opening are rectangular-shaped.

In an embodiment of the present invention, the longitudinal direction of the first opening is perpendicular to the first slot, and the longitudinal direction of the second opening is perpendicular to the first slot.

In an embodiment of the present invention, the connection wire of the first opening and the second opening passes through a center of the first slot.

In an embodiment of the present invention, the chip package structure further includes a plurality of solder balls disposed on the second surface.

In an embodiment of the present invention, the chip package structure further includes a plurality of second conductive wires, and the circuit substrate further includes a plurality of second slots respectively located at an outer side of the adhesive layer. The second conductive wires connect the chip and the second surface of the circuit substrate through the second slots.

In an embodiment of the present invention, the adhesive layer may be a B-stage adhesive.

Based on the above description, since the first opening and the second opening are formed on the solder mask layer to allow the molding compound to flow therein according to the present invention, the chip package structure has a preferable reliability compared with the conventional art under a reliability test.

In order to make the aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a portion of this specification. The drawings illustrate embodiments of the invention and, together with the description, serve to explain the principles of the invention.

DESCRIPTION OF EMBODIMENTS

The First Embodiment

Figure 1A:
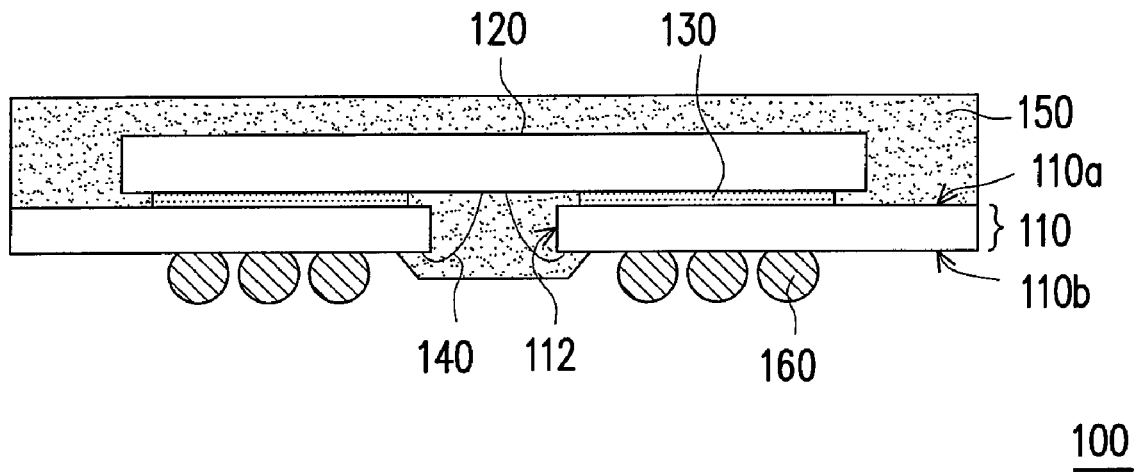
FIG. 1A is a cross-sectional view of a conventional chip package structure.
Figure 1B:
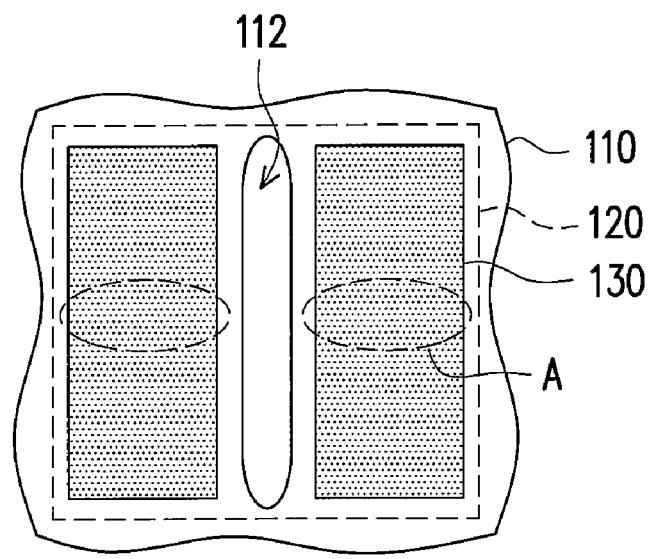
FIG. 1B is a top view of some components of the conventional chip package structure in FIG. 1A.
Figure 2:
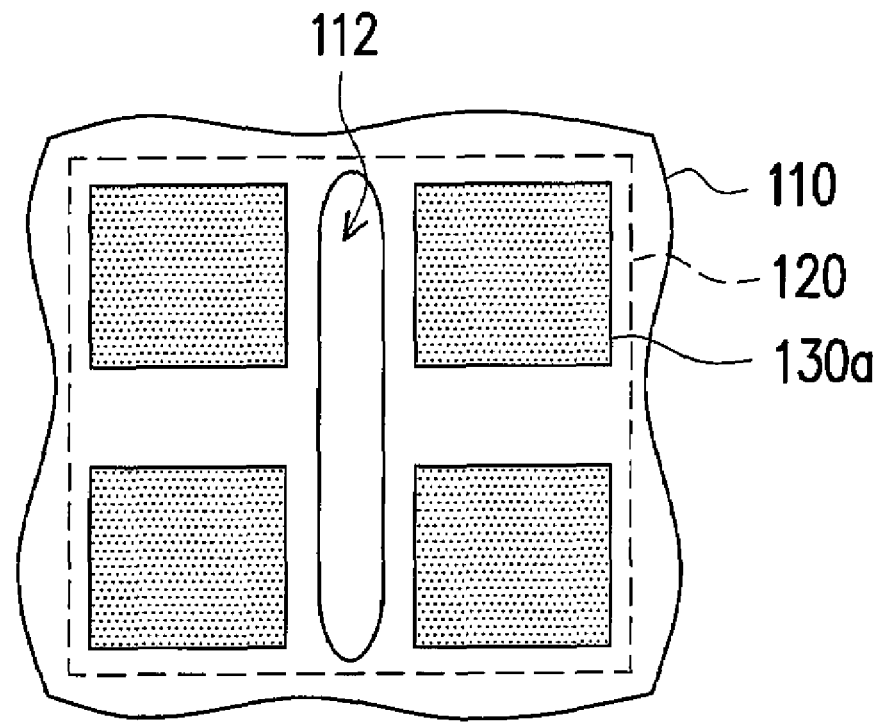
FIG. 2 is a top view of some components of another conventional chip package structure.
Figure 3A:
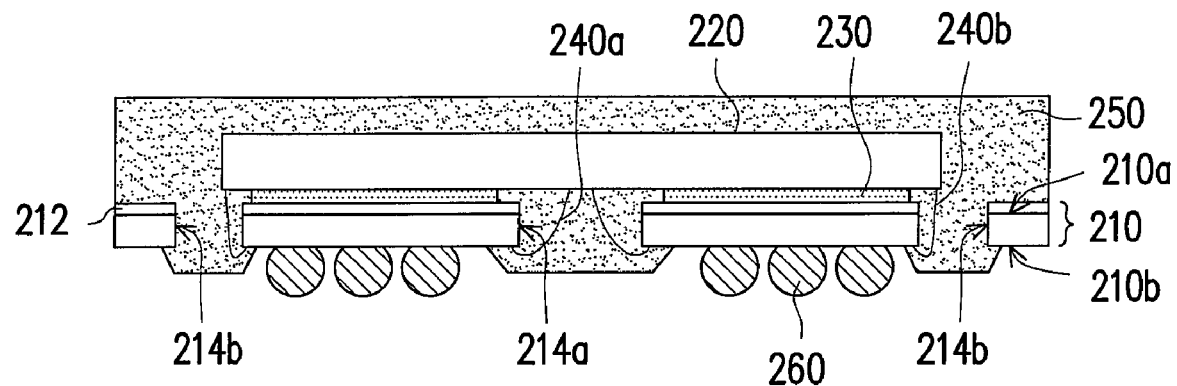
FIG. 3A is a cross-sectional view of a chip package structure according to a first embodiment of the present invention.
Figure 3B:
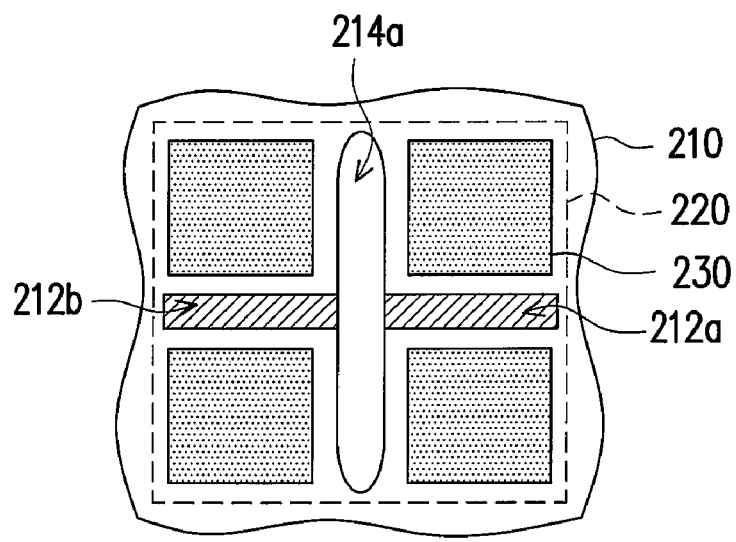
FIG. 3B is a top view of some components of the chip package structure in FIG. 3A.

FIG. 3A is a cross-sectional view of a chip package structure according to a first embodiment of the present invention, and FIG. 3B is a top view of some components of the chip package structure in FIG. 3A. Referring to FIGS. 3A and 3B, for the convenience of illustration, the chip 220 is not shown but is indicated by a dashed line in FIG. 3B. Furthermore, only a portion of the circuit substrate 210 is shown in FIG. 3B.

Referring to FIGS. 3A and 3B, the chip package structure 200 in this embodiment includes a circuit substrate 210, a chip 220, an adhesive layer 230, a plurality of the first conductive wires 240a, and a molding compound 250. The circuit substrate 210 has a first surface 210a, a second surface 210b, a first slot 214a, and a solder mask layer 212, and the solder mask layer 212 is disposed on the first surface 210a. Furthermore, the solder mask layer 212 has a first opening 212a and a second opening 212b respectively exposing a portion of the first surface 210a and respectively located beside the two long sides of the first slot 214a. In this embodiment, the first opening 212a and the second opening 212b are disposed at left and right sides of the first slot 214a, respectively. Moreover, the first slot 214a may be rectangular-shaped or in another shape.

Referring to FIGS. 3A and 3B, the chip 220 is disposed on the first surface 210a, and covers at least a part of the first slot 214a, the first opening 212a, and the second opening 212b.

Furthermore, the adhesive layer 230 is disposed between the chip 220 and the circuit substrate 210, and located at two sides of the first slot 214a, the first opening 212a, and the second opening 212b. The chip 220 is fixed on the circuit substrate 210 through the adhesive layer 230. The first conductive wires 240a connect the chip 220 and the second surface 210b of the circuit substrate 210 through the first slot 214a. Moreover, the adhesive layer 230 may be a B-stage adhesive.

The molding compound 250 covers the chip 220, the adhesive layer 230, the first conductive wires 240a, and a portion of the circuit substrate 210, and is further filling into the first slot 214a, the first opening 212a, and the second opening 212b. In addition, in order to electrically connect the chip 220 to the outside, the chip package structure may also include a plurality of solder balls 260 disposed on the second surface 210b. Furthermore, in order to increase the number of electrical connections between the chip 220 and the circuit substrate 210, the chip package structure may also include a plurality of second conductive wires 240b, and the circuit substrate 210 further has a plurality of second slots 214b respectively located at an outer side of the adhesive layer 230. The second conductive wires 240b connect the chip 220 and the second surface 210b of the circuit substrate 210 through the second slot 214b.

Since the molding compound 250 may be filled in the first opening 212a and the second opening 212b, the chip package structure 200 will not be damaged easily compared with the conventional art under a reliability test. In other words, compared with the conventional art, the chip package structure 200 has a preferable reliability. Furthermore, compared with the thicker adhesive layer employed in the conventional art for facilitating the flowing of the molding, the adhesive layer 230 of the chip package structure 200 in this embodiment is thin. Therefore, the chip package structure 200 in this embodiment has a low material cost.

In this embodiment, the first opening 212a and the second opening 212b are rectangular-shaped. However, in other embodiments, the first opening 212a and the second opening 212b may be round, ellipse, or other shapes, so that the molding compound 250 may be filled in conveniently. Furthermore, in this embodiment, for the convenience of filling the molding compound 250 into the first opening 212a and the second opening 212b, the first opening 212a and the second opening 212b are connected to the first slot 214a, respectively. However, in other embodiments, the first opening 212a or the second opening 212b may also not be connected to the first slot 214a.

In this embodiment, the longitudinal direction of the first opening 212a is perpendicular to the first slot 214a, and the longitudinal direction of the second opening 212b is perpendicular to the first slot 214a. However, in other embodiments, the longitudinal direction of the first opening 212a or the second opening 212b may also form another angle with the first slot 214a. Furthermore, the connection line of the first opening 212a and the second opening 212b passes through the center region of the first slot 214a. However, in other embodiments, the connection wire of the first opening 212a and the second opening 212b may also pass through other regions of the first slot 214a.

The Second Embodiment

Figure 4:
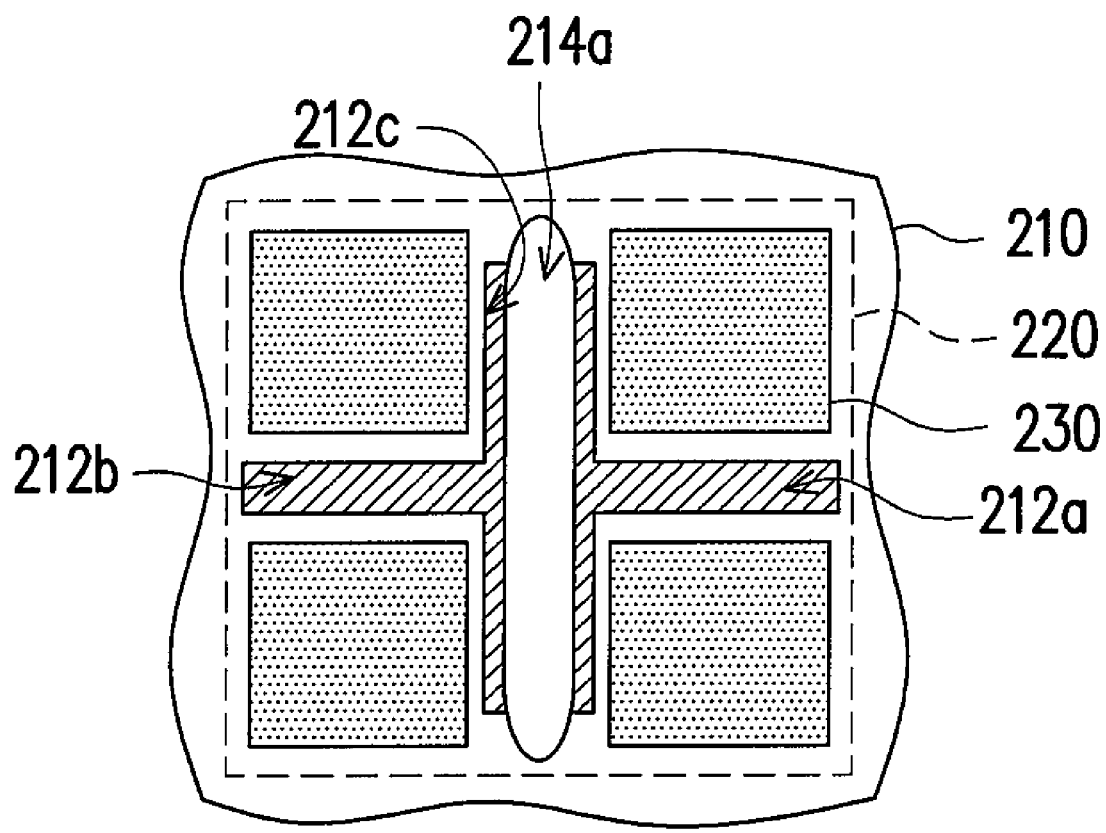
FIG. 4 is a top view of some components of a chip package structure according to a second embodiment of the present invention.

FIG. 4 is a top view of some components of a chip package structure according to a second embodiment of the present invention. Referring to FIG. 4, for the convenience of illustration, the chip 220 is not shown but is indicated by a dashed line FIG. 4. Furthermore, only a portion of the circuit substrate 210 is shown in FIG. 4.

Referring to FIG. 4, this embodiment is similar to the first embodiment, except that the solder mask layer 212 in this embodiment further has a third opening 212c which exposes the first slot 214a and a portion of the first surface 210a at the two sides in the longitudinal direction of the first slot 214a. Furthermore, for the convenience of filling the molding compound 250 into the first opening 212a and the second opening 212b, the first opening 212a and the second opening 212b may be connected to the third opening 212c, respectively. In other words, the molding compound 250 may flow into the first opening 212a and the second opening 212b through the first slot 214a and third opening 212c.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package structure, comprising:
   a circuit substrate, having a first surface, a second surface, a first slot, and a solder mask layer, wherein the solder mask layer is disposed on the first surface, and the solder mask layer has a first opening and a second opening respectively exposing a portion of the first surface and respectively located beside two long sides of the first slot;
   a chip, disposed on the first surface and covering at least a portion of the first slot, the first opening, and the second opening;
   an adhesive layer, disposed between the chip and the circuit substrate and located at the two long sides of the first slot, two sides of the first opening, and two sides of the second opening, wherein the chip is fixed on the circuit substrate through the adhesive layer;
   a plurality of first conductive wires, connecting the chip and the second surface of the circuit substrate through the first slot; and
   a molding compound, covering the chip, the adhesive layer, the first conductive wires, and a portion of the circuit substrate, and further filling into the first slot, the first opening, and the second opening.

2. The chip package structure as claimed in claim 1, wherein the first opening and the second opening are connected to the first slot, respectively.

3. The chip package structure as claimed in claim 1, wherein the solder mask layer further has a third opening exposing the first slot and a portion of the first surface at the two long sides of the first slot.

4. The chip package structure as claimed in claim 3, wherein the first opening and the second opening are connected to the third opening, respectively.

5. The chip package structure as claimed in claim 1, wherein shapes of the first opening and the second opening are rectangular-shaped.

6. The chip package structure as claimed in claim 5, wherein a longitudinal direction of the first opening is perpendicular to the first slot, and a longitudinal direction of the second opening is perpendicular to the first slot.

7. The chip package structure as claimed in claim 1, wherein a connection wire between the first opening and the second opening passes through a center of the first slot.

8. The chip package structure as claimed in claim 1, further comprising a plurality of solder balls disposed on the second surface.

9. The chip package structure as claimed in claim 1, further comprising a plurality of second conductive wires, wherein the circuit substrate further has a plurality of the second slot respectively located at an outer side of the adhesive layer, and the second conductive wires connect the chip with the second surface of the circuit substrate through the second slots.

10. The chip package structure as claimed in claim 1, wherein the adhesive layer comprises a B-stage adhesive.

* * * * *